United States Patent [19]
Ueno et al.

[11] Patent Number: 5,202,887
[45] Date of Patent: Apr. 13, 1993

[54] ACCESS CONTROL METHOD FOR SHARED DUPLEX DIRECT ACCESS STORAGE DEVICE AND COMPUTER SYSTEM THEREFOR

[75] Inventors: Hitoshi Ueno, Zama; Masahiro Kitano, Hiratsuka; Kenji Masuda, Hadano, all of Japan

[73] Assignees: Hitachi, Ltd., Tokyo; Hitachi Computer Engineering Co., Ltd., Kanagawa, both of Japan

[21] Appl. No.: 541,749

[22] Filed: Jun. 21, 1990

[30] Foreign Application Priority Data

Jun. 21, 1989 [JP] Japan .................. 1-156805

[51] Int. Cl.⁵ ........................................... G06F 11/00
[52] U.S. Cl. ..................... 371/10.1; 371/8.1
[58] Field of Search ........ 371/10.1, 10.2, 8.1, 371/7

[56] References Cited

U.S. PATENT DOCUMENTS

| | | | |
|---|---|---|---|
| 3,676,860 | 7/1972 | Collier et al. ................ | 364/200 |
| 3,725,872 | 4/1973 | Balogh, Jr. et al. .............. | 364/200 |
| 4,187,538 | 2/1980 | Douglas et al. ................ | 364/200 |
| 4,308,580 | 12/1981 | Ohtaki ................. | 364/200 |
| 4,342,079 | 7/1982 | Stewart et al. ................ | 364/200 |
| 4,376,300 | 3/1983 | Tsang ................. | 371/10.1 |
| 4,574,350 | 3/1986 | Starr ................. | 364/200 |
| 4,621,318 | 11/1986 | Maeda ................. | 364/200 |
| 4,847,754 | 7/1989 | Obermarck et al. .............. | 364/200 |
| 4,937,733 | 6/1990 | Gillett, Jr. et al. .............. | 364/200 |
| 4,984,153 | 1/1991 | Kregness et al. ................ | 364/200 |
| 5,051,887 | 9/1991 | Berger et al. ................ | 395/425 |

FOREIGN PATENT DOCUMENTS 6120148  1/1986  Japan .

Primary Examiner—Robert W. Beausoliel
Assistant Examiner—Allen M. Lo
Attorney, Agent, or Firm—Antonelli, Terry, Stout & Kraus

[57] ABSTRACT

Disclosed is a DASD access control method including storing information for identifying one data group in which an irrecoverable failure has occurred in the plurality of data groups stored in each of the first and second DASDs constituting the duplex DASD pair. A judgment is determined based on the stored information as to whether one data group has an irrecoverable failure which has occurred when the one data group held in either one of the first and second DASDs constituting the duplex DASD pair is accessed by one of the plurality of processing units. Access is allowed to the one data group in the one DASD by the one processing unit when the judgment results in that the one data group has no irrecoverable failure which has occurred therein. Finally, the access is stopped to the one data group when the judgment results in that the one data group has an irrecoverable failure which has occurred therein.

21 Claims, 12 Drawing Sheets

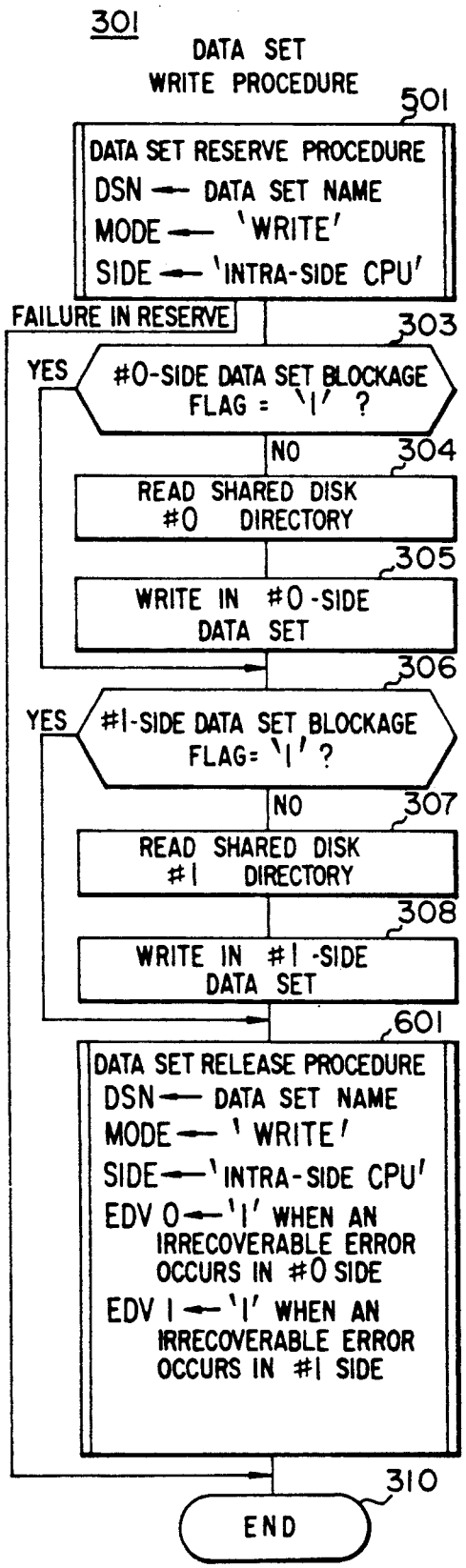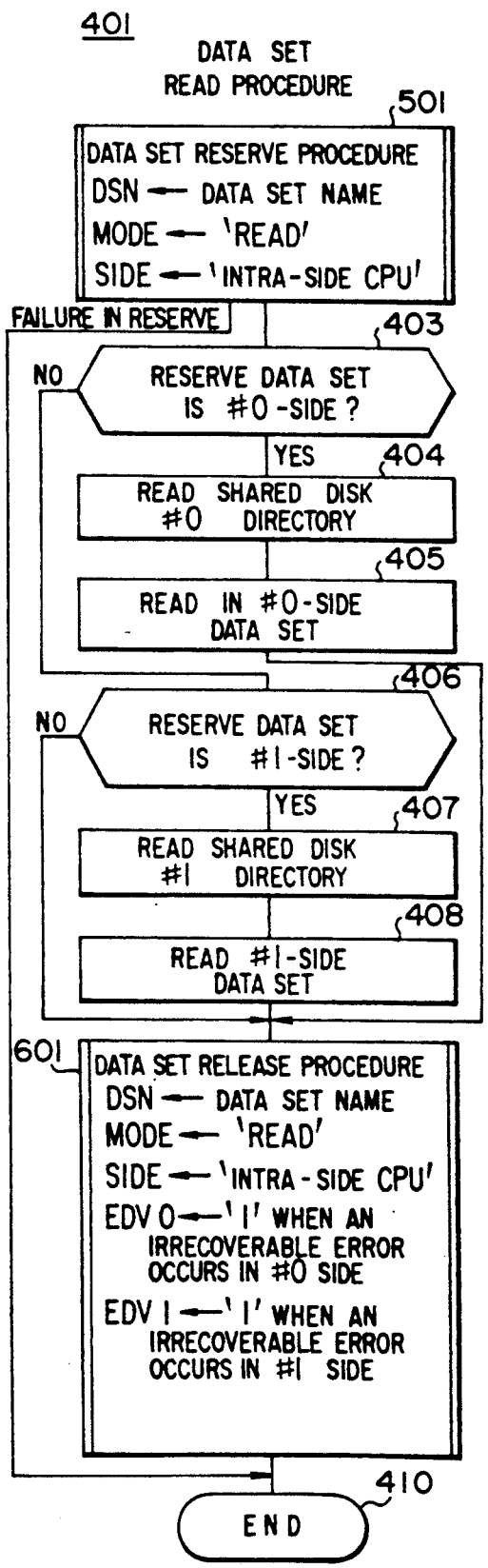

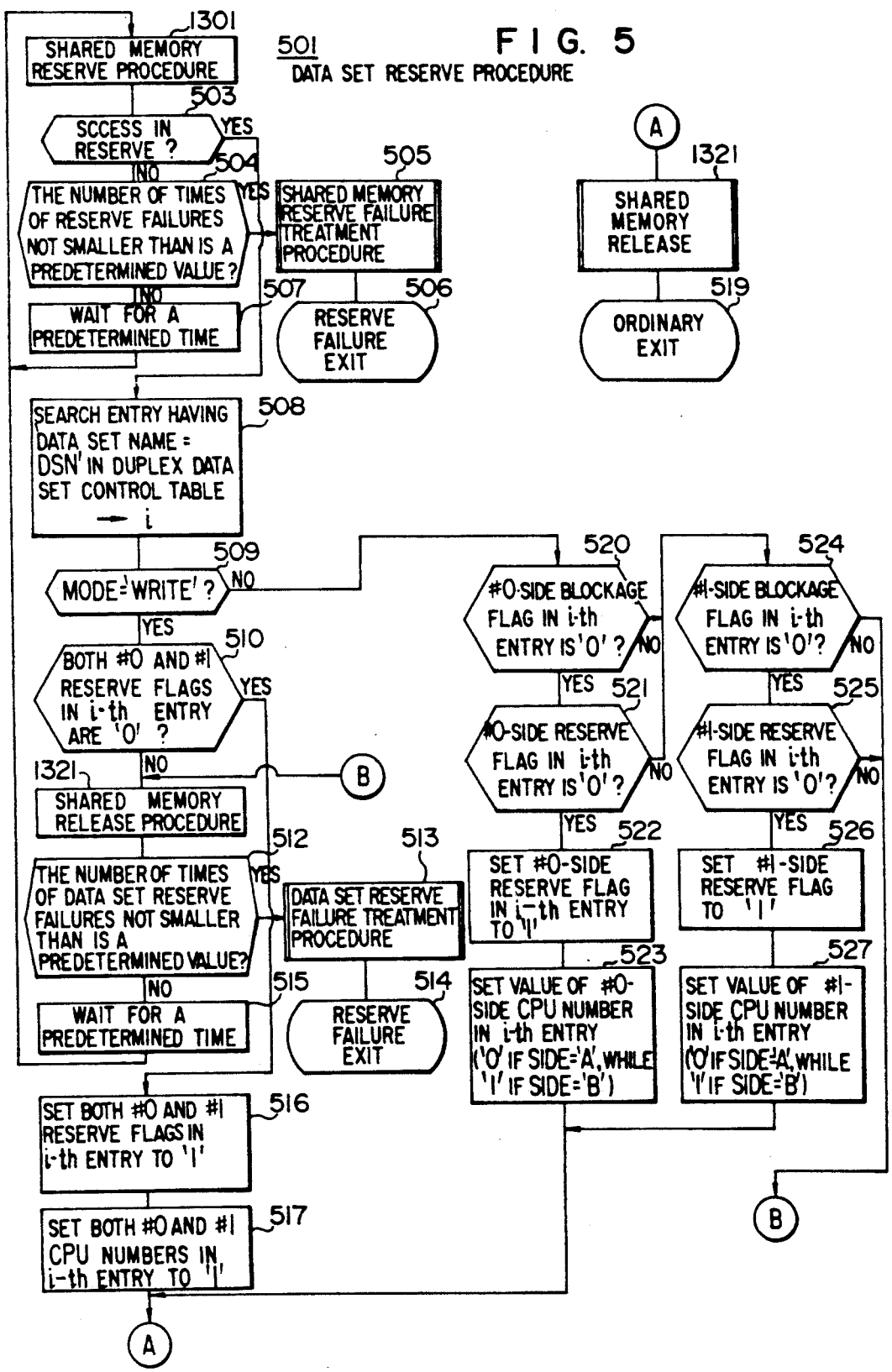

X : SOLID FAILURE OCCURRENCE POSITION

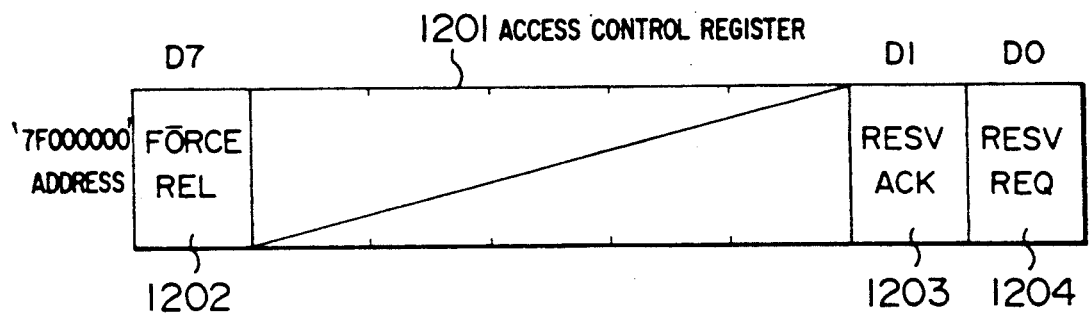
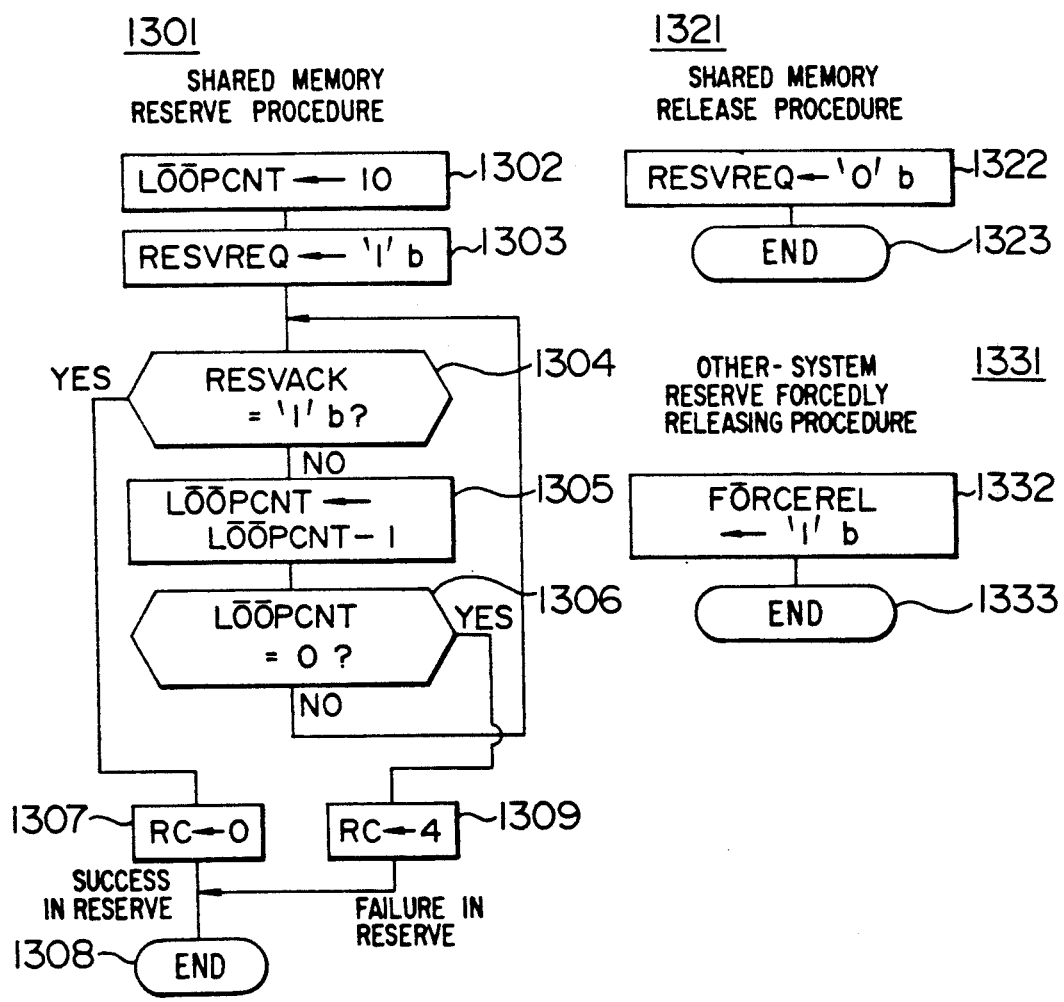

ACCESS CONTROL METHOD FOR SHARED DUPLEX DIRECT ACCESS STORAGE DEVICE AND COMPUTER SYSTEM THEREFOR

BACKGROUND OF THE INVENTION

The present invention relates to a direct access storage device (hereinafter referred to as DASD) shared by a plurality of central processing units.

In Japanese Patent Unexamined Publication Nos. Sho-61-20148 and Sho-61-43356, there is provided a file controller connected independently of a DASD and logically divided into blocks to thereby carry out exclusive control on each block as an access unit.

On the other hand, in a computer system disclosed in Japanese Patent Unexamined Publication No. Sho-61-32151, in which a plurality of central processing units share a pair of duplex DASDs, exclusive control of access to the shared duplex DASDs is carried out by using a hardware reserving function in which the whole of the DASDs is reserved or released by an exclusive control circuit in the DASDs or in a controller of the DASDs, or is carried out by communication of reserve or release requests between the plurality of central processing units.

In a system disclosed in Japanese Patent Unexamined Publication No. Sho-61-62918, as a failure recovery procedure for one of a pair of shared duplex DASDs, the whole of the failed DASD is first blocked and then necessary data sets are reconstructed on a newly provided DASD, so that the operation of the pair of shared duplex DASDs is continued.

Further, Japanese Patent Unexamined Publication No. Sho-61-67153 discloses a failure recovery method in which, in a case where a failure occurs in a DASD, a reserved area preliminarily secured is assigned as an alternative area to avoid a portion where the failure occurs.

In the aforementioned conventional technology, in case of an occurrence of a failure in the DASDs, blocking control is carried out by DASD. In short, in the case where a partial failure occurs in a DASD, a reserved area is assigned as an alternative area for the failure portion so that the central processing unit can operate with no sense of the partial failure. Accordingly, not only in the case where access onto the whole DASD becomes impossible, but in the case where partial failure occurs frequently to make the alternative area insufficient, the blocking procedure by the DASD is carried out.

For example, in a magnetic disk device which is a kind of DASD, in most cases a "track" is used as a physical failure control unit. In other words, when a disk controller which has accepted an input/output request from a central processing unit detects an access failure portion in which reading/writing is impossible, the disk controller executes an alternative track assignment to assign a track containing the failure portion to a reserved track. However, when a partial failure occurs so frequently that all alternative tracks are drained, the whole disk device must be blocked even in the case where an access failure of one track occurs in the disk device.

In the case that one DASD in a pair of duplex DASDs is blocked as described above, and a stationary access failure occurs on the other DASD, it becomes impossible to obtain access on all the duplex data sets on the duplex DASDs.

In other words, even when a partial failure occurs under the condition that alternative areas such as alternative tracks are insufficient, duplex access on the whole of the pair of duplex DASDs is made impossible. There arises a problem in that reliability on the DASDs is lowered remarkably compared with the case where duplex access is being executed.

In the case where duplex access can be made, for example, at the time of access to different data sets, at the time of read only access, etc., a plurality of CPUs can obtain access to individual DASDs in parallel. However, when duplex access is made impossible by the blockade for one DASD, access from the plurality of CPUs is concentrated onto the other DASD to spoil the property of parallel processing of dispersing access to the two DASDs. Therefore, there arises a problem in that processing performance of the computer system is lowered.

In the aforementioned conventional technology, in order to construct a computer system using a pair of shared duplex DASDs, it is necessary that communication paths be between the CPUs for exclusive control or communication paths between the CPUs and a file, and a controller for executing exclusive control are provided so that the CPUs execute reserve or release of the data sets according to a specific communication procedure. In other words, in the aforementioned conventional technology, the same communication path as used in a standard input/output device is used both in the case of communication paths between the CPUs and in the case of communication paths between the CPUs and a file controller. Accordingly, a series of procedures such as command generation and data generation for the input/out channels, the starting of the input/output channels, the input/output interrupt waiting, the input/output interruption, and the like, is required whenever communication is made. In a small-scaled computer system, processing overhead caused by the communication procedure cannot be neglected.

Further, in the conventional technology in which a file controller is used to control access by a data set, there is a risk that when a plurality of CPUs are attempting access to the file controller simultaneously, one of the CPUs frequently obtains access to the file controller so that the access of the other CPUs to the file controller is made difficult.

SUMMARY OF THE INVENTION

An object of the present invention is to provide a DASD access control method in which a function as duplex DASDs is stopped only in a failure portion when a partial failure occurs in one DASD, and in which the duplex DASDs are used so as to be operated as one DASD with respect to the failure portion.

Another object of the invention is to provide a DASD access control method in which, when one CPU stops, the reserve state can be forcedly released by another CPU.

A further object of the invention is to provide a computer system in which reserving or releasing of the data sets can be made with low overhead.

In order to accomplish the above objects, according to an aspect of the present invention, the DASD access control method comprises the steps of:

(a) storing information for identifying one data group in which an irrecoverable failure has occurred in the plurality of data groups held in the first DASD and the second DASD which constitute the duplex DASD pair;
(b) making a judgment based on the stored information as to whether or not one data group has an irrecoverable failure which has already occurred therein when the one data group held in either the first DASD or the second DASD constituting the duplex DASD pair is accessed by one of the plurality of processing units;
(c) allowing access to the one data group in the one DASD by the one processing unit when the judgment results in determination that the one data group does not have an irrecoverable failure which has occurred therein; and
(d) stopping access to the one data group when the judgment results in determination that the one data group has an irrecoverable failure which has occurred therein.

According to another aspect of the present invention, the DASD access control method comprises the steps of:
(a) storing reserve flags in a shared random access memory provided commonly to the plurality of processing units, the reserve flags respectively corresponding to the plurality of data groups held in each of the first and second DASDs constituting the duplex DASD pair, each of the reserve flags being provided to indicate whether or not the corresponding data group is in a reserve state;
(b) reserving the random access memory for one of the plurality of processing units when the one processing unit makes access to one of the plurality of data groups stored in one of the first and second DASD constituting the duplex DASD pair;
(c) reading one reserve flag corresponding to the one data group from the random access memory;
(d) rewriting the one reserve flag into a reserve indicating state to thereby reserve the one data group when the readout one reserve flag is not in the reserve indicating state; and
(e) releasing the reserve state of the random access memory and making access to the one data group by the one processing unit.

According to a further aspect of the present invention, the computer system comprises:
a random access memory for storing a plurality of pieces of control information respectively corresponding to a plurality of data groups held in a DASD and for controlling access from a plurality of processing units to the data groups; and
an access control circuit connected to the plurality of processing units and the random access memory for controlling the execution of access from the plurality of processing units to the random access memory;
the access control circuit including:
reserving means for reserving the random access memory for one of the processing units in response to a random access memory reserve request instruction issued by the one processing unit, and for releasing the reserve state in response to a random access memory reserve releasing request instruction issued by the one processing unit; and
control means connected to the reserving means for controlling execution of access to one of the pieces of control information in the random access memory requested by an instruction issued by one of the processing units based on whether or not the random access memory is in a reserved state with respect to the one processing unit.

DESCRIPTION OF THE DRAWINGS

Other features and advantages of the present invention will be apparent from the following description taken in connection with the accompanying drawings, wherein:

FIG. 3 is a flow chart of a data set writing procedure;

FIG. 4 is a flow chart of a data set reading procedure;

FIG. 5 is a flow chart of a data set reserving procedure;

FIG. 12 is a view showing data in an access control register (201) used in the system depicted in FIG. 11;

FIG. 13 is a flow chart of a shared memory device reserving procedure;

FIG. 14 is a flow chart of a shared memory device releasing procedure;

DESCRIPTION OF THE PREFERRED EMBODIMENTS

Figure 1:
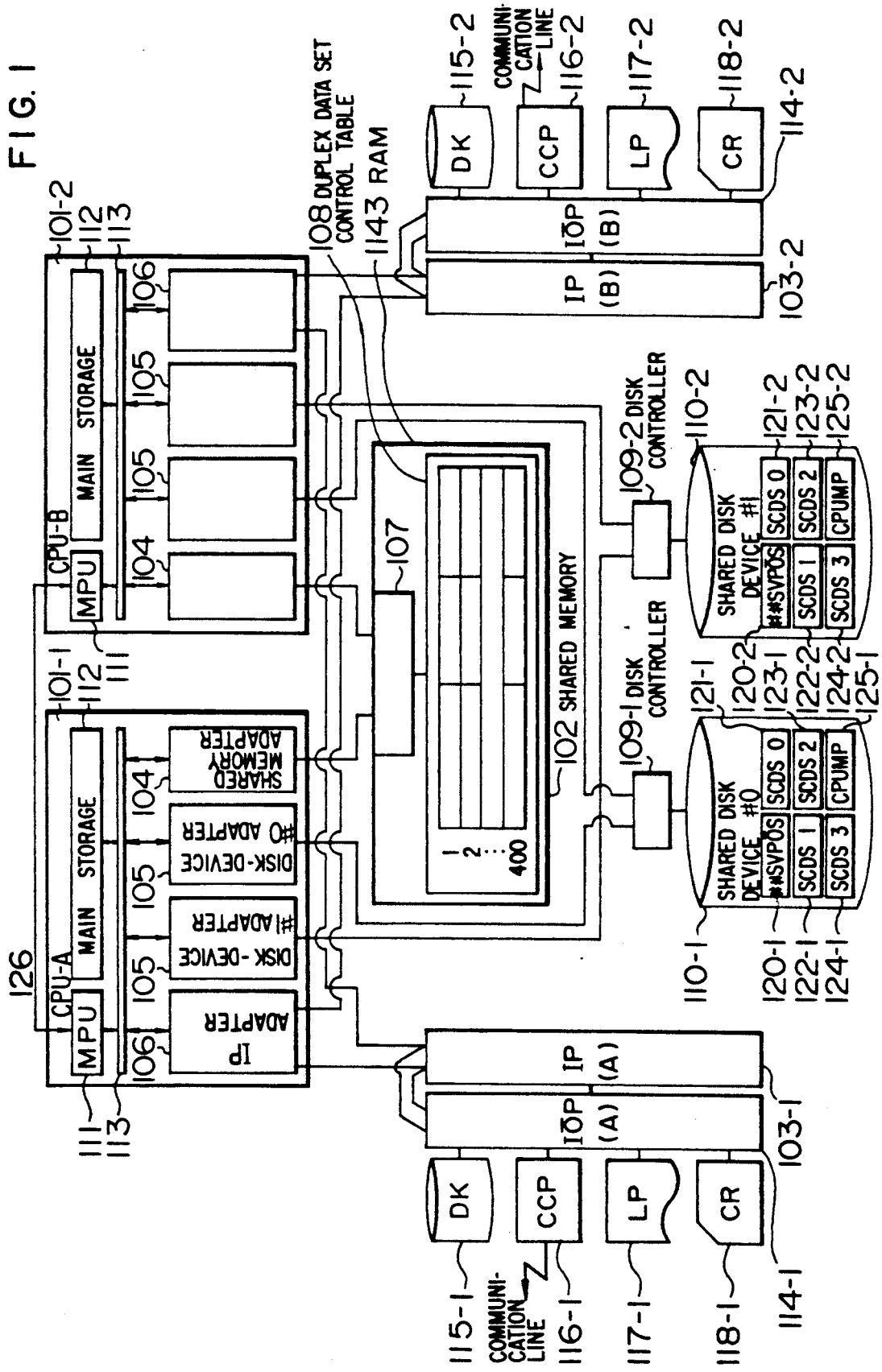
FIG. 1 is a block diagram of a computer system according to the present invention.

Before the preferred embodiments of the invention are specifically described, the operation thereof will be briefly described.

One feature of the present invention resides in the fact that a plurality of CPUs using a shared duplex DASD pair have a shared storage device for exclusively controlling data sets to thereby control the shared duplex DASD pair suitably.

In short, one control information set for each data set for each DASD of the pair of DASDs forming the shared duplex DASD pair is recorded on the shared storage device. One control information set is composed of three items: a "data set reserve flag" indicating that one data set is reserved so as to be read or written exclusively by one CPU; a "reserve CPU number" which operates as an identifier for identifying CPU securing the reserved state; and a "data set blockage flag" indicating that a stationary failure makes it impossible to read or write the data set.

A program operating in each of the CPUs serves to execute both exclusive control of a pair of duplex data sets on the shared duplex DASD pair and blockage control at the time of a failure of access to the shared duplex DASD pair, by using the following control method.

a). Duplex Data Set Reserving Procedure (In Reading)

The method comprises the following steps.
(1) The shared storage device is reserved.
(2) The control information corresponding to the data set to be read is searched. (Because one control information set exists in one data set on one DASD, two control information sets exist in each duplex data set).
(3) The reserve flags, the reserve CPU numbers and the blockage flags of the two searched control information sets are checked, and when at least one of the control information sets satisfies the condition "reserve flag=0 and blockage flag=0", the reserve flag of the control information set is rewritten to 1 and the reserve CPU number is set to the identification number of the CPU;
(4) The shared storage device is released.
(5) The CPU executes reading for the data set on the DASD satisfying the aforementioned condition.

b). Duplex Data Set Reserving Procedure (In Writing)

The method comprises the following steps.
(1) The shared storage device is reserved.
(2) The control information corresponding to the data set to be written is searched. (Because one control information set exists in one data set on one DASD, two control information sets exist in each duplex data set).
(3) The reserve flags, the reserve CPU numbers and the blockage flags of the two searched control information sets are checked, and when both the control information sets satisfy the condition "reserve flag=0 and blockage flag=0", each of the reserve flags of the two control information sets is set to 1 and the reserve CPU number is set to the identification number of the CPU.
(4) The shared storage device is released.
(5) The CPU executes writing the same contents into the data sets on the two DASDs.

c). Duplex Data Set Releasing Procedure (1) The shared storage device is reserved.
(2) The control information corresponding to the data set with respect to which reading or writing is to be ended is searched. (Because one control information set exists in one data set on one DASD, two control information sets exist in each duplex data set).
(3) The reserve flags, the reserve CPU numbers and the blockage flags of the two searched control information sets are checked, and when at least one of the control information sets satisfies the condition "reserve flag=1 and reserve CPU number=-CPU identification number", the reserve flag of the control information set satisfying the condition is set to 0.
(4) The shared storage device is released.

d). Data Set Blocking Procedure In Detecting Failure (1) The shared storage device is reserved.
(2) The control information corresponding to the data set in which a failure has been detected in writing or in reading is searched. (Because one control information set exists in one data set on one DASD, two information sets exist in each duplex data set).
(3) The data set blockage flag contained in the control information set corresponding to the data set in which a failure has been detected is set to 1, and the reserve flag thereof is set to 0.
(4) The shared storage device is released.

Another feature of the present invention is a means for setting the data set reserve flag on the shared storage device forcedly to 0.

When a failure in another CPU is detected, the value of the data set reserve flag reserved by the other CPU is set to 0 by the method which comprises the following steps.

(1) The reserved state of the shared storage device by the failed CPU is forcedly released.
(2) The intra-system CPU reserves the shared storage device.
(3) The control information satisfying the condition "reserve flag=1 and reserve CPU number=failed CPU identification number" is searched in the control information in all the data sets recorded in the shared storage device.
(4) The reserve flag of each of the control information sets satisfying the aforementioned condition is set to 0.

A further feature of the present invention resides in the fact that a plurality of CPUs using a shared duplex DASD pair have a shared storage device for executing exclusive control. The shared storage device is a storage device in which read/write operations can be executed in accordance with an ordinary instruction from each CPU, and by which the procedure of generating channel commands or the procedure of I/0 completion interruption in I/0 processing through I/0 channel devices as in a conventional file controller can be omitted, so that the overhead for the exclusive control can be reduced.

A still further feature of the present invention resides in the fact that the shared storage device is provided with an exclusive control circuit having an alternating access control circuit for suppressing continuous access of one CPU, by which when competition between CPUs exists with respect to access therefrom, continuous access from one CPU can be prevented. The alternating access control circuit comprises registers for registering all the CPUs currently issuing access requests to the shared storage device, and a reserve circuit for accepting the requests of the CPUs registered in the registers.

As described above, a control information set (per one data set) composed of three items "data set reserve flag", "reserve CPU number" and "data set blockage flag" is provided between a plurality of CPUs using a shared duplex DASD pair (comprising a pair of DASDs). By controlling the CPUs by the aforementioned method, data set access in the shared DASD pair can be exclusively controlled for each data set. Accordingly, even in the case where a partially stationary failure of the DASD pair occurs, each data set containing a failed portion can be partially blocked.

Further, by providing both a function of forcedly releasing the reserved state set by another CPU and a function of resetting the data reserve flag set by the one CPU, the condition that the reserved state of the data set used by one CPU cannot be released in the case where the CPU suddenly stops because of a failure or the like can be prevented.

Reading and writing recording data in the shared storage device can be carried out based on a shared storage device access instruction directly executed by a CPU.

Continuous access by a specific CPU to the shared storage device can be prevented as follows. That is, the exclusive control circuit of the shared storage device is constituted by an alternating access control circuit by which when competition between two or more CPUs occurs with respect to access therefrom, after completion of access by one CPU access by any other CPU is certainly allowed.

Now, the preferred embodiments of the present invention will be described in detail with reference to the drawings. FIG. 1 is a block diagram showing the configuration of the large-scale computer system according to the present invention. The large-scale computer system according to the present invention has a single mode in which two instruction processors (hereinafter simply abbreviated to "IPs")103-1 and 103-2 operate under the same operating system so as to serve as a single computer, and a separate mode in which the two IPs 103-1 and 103-2 operate under individual operating systems respectively so as to serve as two independent computers. The central processing units 101-1 and 101-2 are generally called service processors for performing operation and maintenance of the two IPs 103-1 and 103-2 and the two input/output processors (hereinafter simply abbreviated to "IOPs") 114-1 and 114-2. In short, at the time of the starting of the large-scale computer, the central processing units perform both resetting of the IOPs 114-1 and 114-2 and loading of a micro program. At the time of occurrence of a failure or at the time of maintenance, the central processing units perform both data reading from a pair of shared disk devices 110-1 and 110-2 and data writing therein to reserve the inside information of the IPs 103-1 and 103-2 and the IOPs 114-1 and 114-2.

Because the operation and maintenance of the IPs 103-1 and 103-2 and the IOPs 114-1 and 114-2 must be carried out at any time and separately in the separate mode, the two central processing units 101-1 and 101-2 are provided separately. Further, because the operation and maintenance must be conducted by one central processing unit 101-1 or 101-2 in the single mode, all the information must be obtained from the one central processing unit 101-1 or 101-2. Accordingly, information recorded in a disk device, such as for example, information pertaining to hardware construction, must be used so as to be shared by to the two central processing units 101-1 and 101-2.

For those reasons, the two central processing units 101-1 and 101-2 are provided in this embodiment and share the disk devices 110-1 and 110-2.

In FIG. 1, the central processing unit-A and the central processing unit-B have the same construction. If those central processing units are put under the same condition, the operations thereof are the same. Accordingly, the operations of the central processing units will be understood sufficiently if the operation of only one of those central processing units is described. In short, the operation of one central processing unit-A 101-1 will be explained hereunder.

The inside of the central processing unit 101-1 is constituted by a main storage 112 for storing a program, a micro-processor 111 for executing the program, an IP adapter 106 for connecting the IPs 103-1 and 103-2 and IOPs 114-1 and 114-2, two disk device adapters 105, and a shared memory adapter 104. These constituent parts are connected to each other through a common bus 113.

An IP adapter 106 in the central processing unit 101-1 is connected to the corresponding IPs 103-1 and 103-2 and IOPs 114-1 and 114-2. Peripheral devices such as magnetic disk devices 115-1 and 115-2, communication control processors 116-1 and 116-2, line printers 117-1 and 117-2, and card readers 118-1 and 118-2 are connected to the IOPs 114-1 and 114-2, respectively. These peripheral devices are used based on a program operating on one IP 103-1 or 103-2, regardless of the central processing units 101-1 and 101-2. The shared disk devices 110-1 and 110-2 are not peripheral devices connected to the IOPs 114-1 and 114-2, so that they operate entirely independent of these peripheral devices.

As described above, the central processing unit-A 101-1 and the central processing unit-B 101-2 can take a single mode in which the central processing units serve as a single system, as a whole, having a hot standby structure in which the central processing unit-A 101-1 and the central processing unit-B 101-2 are used as a real system and an alternative system respectively, and can take a separate mode in which the two central processing units serve as two separate systems, namely, A side system and B side system which operate independently. In any case, the two central processing units 101-1 and 101-2 share a pair of magnetic disk devices 110-1 and 110-2 which are one kind of DASDs.

Further, a mutual supervisory line 126 is connected between the central processing unit-A 101-1 and the central processing unit-B 101-2 so that each central processing unit supervises the operating condition of the other central processing unit. Signals for reporting machine-check interruption at the time of an occurrence of a hardware failure, signals periodically issued for inquiring of the other central processing unit 101-1 or 101-2 about survival confirmation, and signals responsive to the inquiry from the other central processing unit 101-1 or 101-2 are passed through the mutual supervisory line 126.

In the following, the necessity of the duplex DASD pair is described.

Generally, a central processing unit (101-1, 101-2) is a set of electronic circuit parts and the reliability thereof is one figure higher than that of a disk device (110-1, 110-2) including mechanical parts. As an example, the MTBF (mean time between failures) of a central processing unit (101-1) is not less than hundreds of thousands of hours, whereas the MTBF of a disk device is not less than tens of thousands of hours. Accordingly, duplex disk devices are in most cases used in a computer system requiring high reliability. In this embodiment, each of the central processing units 101-1 and 101-2 can make access to the two disk devices 110 1 and 110-2 through two disk controllers 109-1 and 109-2 from the two disk device adapter 105. Those two disk devices 110-1 and 110-2 take a shared duplex disk configuration in which the two disk devices hold data of the same contents. That is, data sets, such as "##SVPOS (120-1, 120-2)" which store a program for controlling the respective central processing units 101-1 and 101-2, "SCDSO (121-1, 121-2)"- "SCDS3 (124-1, 124-2)" which store the construction of peripheral devices connected to the respective IOPs 114-1 and 114-2, "CPUMP (125-1, 125-2)" which store a micro-program for controlling the respective IPs 103-1 and 103-2, and the like, are doubly recorded on the pair or shared duplex disk devices 110-1 and 110-2. Hereinafter, those data sets are referred to as "duplex data sets".

In the following, the shared memory device 102 is described.

The shared memory device 102 stores data set exclusive control information, which will be described later, necessary for embodying the present invention. Data transfer between the memory device and an MPU 111 is carried out through the shared memory adapter 104 in each central processing unit 101-1 or 101-2. The shared memory device 102 comprises an access control circuit 107 connected to the two central processing units 101-1 and 101-2, and a random access memory RAM 1143 including a duplex data set control table which stores data set exclusive control information The access control circuit 107 makes the reserve-requiring central processing unit 101-1 or 101-2 access the shared memory device 102 monopolistically so that the other central processing unit 101-2 or 101-1 cannot make access to the shared memory device 102 before the central processing unit 101-1 or 101-2 releases the shared memory device 102. In the case where a stop state in which the program cannot be executed occurs in the condition that the shared memory device is being reserved by one central processing unit 101-1 or 101-2, the other central processing unit 101-2 or 101-1 can forcedly cancel the reserved state. The access control circuit 107 will be described later in detail with reference to FIG. 11.

The duplex data set control table 108 in the shared memory device 102 has one entry for a pair of duplex data sets, such as for example "##SVPOS (120-1, 120-2)". The term "data set" means one logical control unit used for avoiding overlapping of the program areas when one program operating on the central processing unit 101-1 or 101-2 uses the disk device 110-1 or 110-2. In short, the term "data set" is similar in concept to the term "file" used generally.

Figure 2:
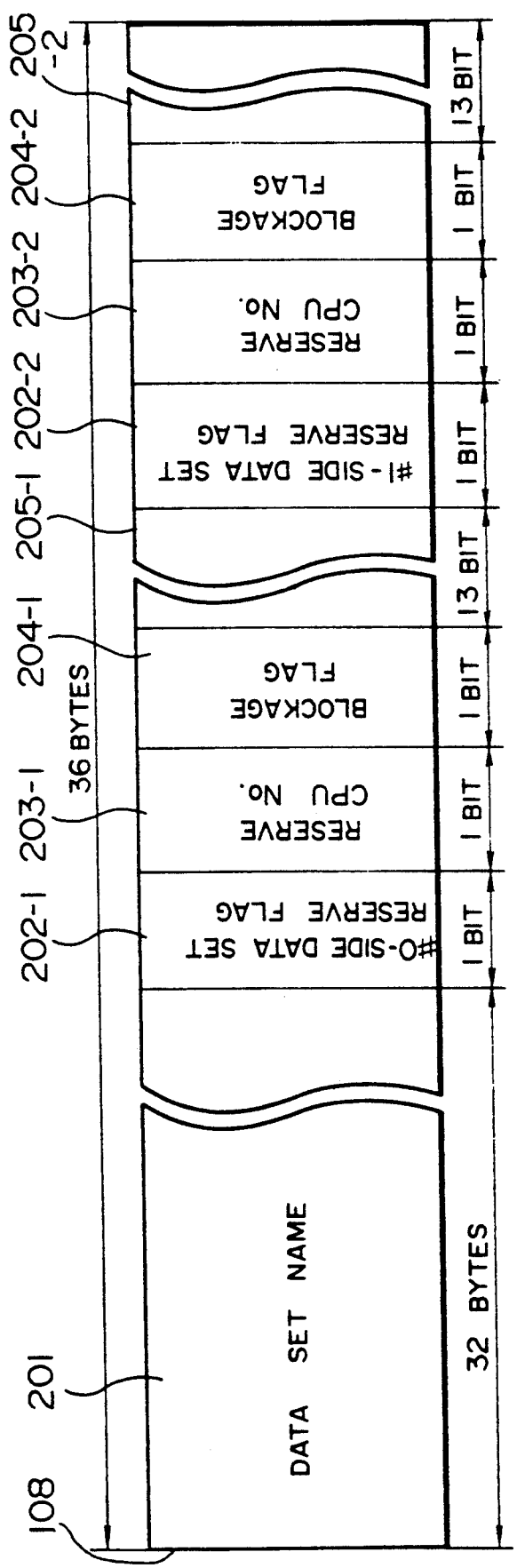
FIG. 2 is a view showing the structure of one entry of a duplex data set control table (108) in a shared memory device (102) in FIG. 1.

FIG. 2 is a view showing the structure of one entry of the duplex data set control table 108. One entry has a length of 36 bytes: the initial 32 bytes used for recording the data set name (represented by 201) of the duplex data set; the next 2 bytes used for recording exclusive control information pertaining to the shared disk device #0 110-1 side data set; and the final two bytes used for recording exclusive control information pertaining to the shared disk #1 110-2 side data set. In each of these 2-byte control information fields, 13 bits (represented by 205) except the initial 3 bits are not used.

The exclusive control information pertaining to the shared disk #0-side data set is composed of a 0-side data reserve flag 202-1 for judging whether or not the data set identified by the data set name 201 in the shared disk #0 110-1 is in a reserved state, a 0-side data set reserve central processing unit number 203-1 for indicating the central processing unit 101-1 or 101-2 reserving the data set when the reserve flag 202-1 is switched on, and a 0-side data set blockage flag 204-1 for indicating that the data set is in an access-disabled state. The exclusive control information 202-2, 203-2 and 204-2 pertaining to the shared disk #1-side data set has the same structure.

As described above, the duplex data set control table 108 has two exclusive control information sets, that is, a shared disk #0 110-1 side exclusive control information set and a shared disk #1 110-2 side exclusive control information set, corresponding to a pair of duplex data sets.

Figure 6:
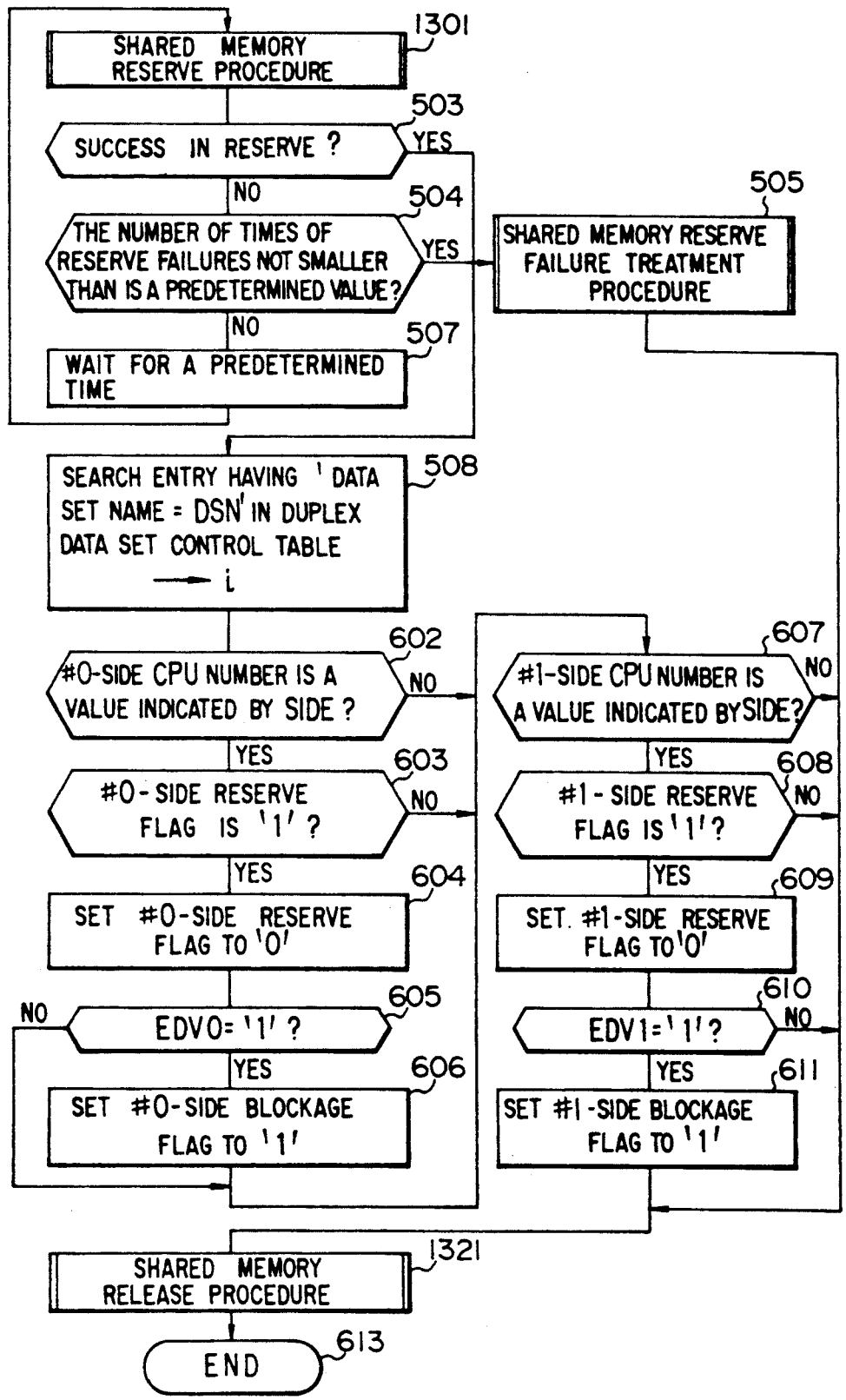
FIG. 6 is a flow chart of a data set releasing procedure.

FIG. 3 is a flow chart of a data set write procedure 301 in which one central processing unit 101-1 or 101-2 performs writing in a duplex data set on the shared disk devices 110-1 and 110-2. The data set is written in a manner as follows. A corresponding 0-side and 1-side data set is reserved (Step 501). The detail of the reserving procedure is shown in FIG. 5. When the reserving procedure results in a failure, occurrence of some abnormality is indicated, so that the data set write procedure is interrupted (Step 310). When the reserving procedure results in success, directory information of the shared disk device #0 is read (Step 304) to detect the physical position of the data set if the 0-side data set can be accessed (Step 303). Then, the operation of writing the data set into the physical position is performed (Step 305). The writing operation for the 1-side disk is carried out in the same manner as that for the 0-side disk device (Steps 306, 307, 308). When the writing operation is completed, the data set is released (Step 601). The detail of the data set release procedure is shown in FIG. 6. When an irrecoverable write error occurs in any one of the disk devices, the blocking state is indicated at the time of the releasing of the data set. Accordingly, parameters EDV0 and EDV1 are set to thereby report the presence or absence of the occurrence of an error to the releasing procedure (Step 601). EDV0 and EDV1 represent flags provided to indicate the occurrence of an irrecoverable error at the time of the shared disk #0-side access and at the time of the shared disk #1-side access, respectively. When an error occurs, the corresponding flag EDV0 or EDV1 is set to "1". When there is no error, each of the flags is set to "0".

FIG. 4 is a flow chart of a data set read procedure 401 in which one central processing unit performs reading from one data set on the shared disk devices. The data set is read in a manner as follows. A corresponding 0-side and 1-side data set is reserved (Step 501). The detail of the reserving procedure is shown in FIG. 5. When the reserving procedure results in a failure, occurrence of some abnormnality is indicated, so that the data set read procedure is interrupted (Step 410). When the reserving of the 0-side data set results in success (Step 403), directory information of the shared disk device #0 is read (Step 404) to detect the physical position of the data set. Then, the operation of reading the data set from the physical position is performed (Step 405). Also in the case where reserving of the 1-side disk device results in success (Step 406), the same reading operation as the 0-side reading operation is made (Steps 407 and 408). When reading operation is completed, the data set reserved by the central processing unit is released (Step 601). The detail of the releasing procedure is shown in FIG. 6. When an irrecoverable read error occurs in any one of the disk devices, the blocking state is indicated at the time of the releasing of the data set. Accordingly, parameters EDV0 and EDV1 are set to thereby transmit the presence or absence of the occurrence of an error to the releasing procedure (Step 601).

FIG. 5 is a flow chart of the data set reserving procedure 501. The duplex data set control table 108 (FIG. 1) must be accessed to reserve a certain data set, so that the shared memory device 102 must be reserved (Step 1301). The detail of the shared memory reserving procedure is shown in the shared memory reserving procedure 1301 in FIG. 13. When the shared memory device 102 reserving procedure results in a failure (Step 503), the shared memory device 102 reserving procedure 1301 is retried after waiting for about tens of msec (Step 507) if the number of times in the reserving failure is within a predetermined value (Step 504). If the number of times is over the predetermined value, occurrence of abnormality pertaining to the shared memory device 102 access is supposed so that the current position of the procedure advances to a reserving failure exit (Step 506) after a shared memory reserving failure procedure such as reporting of a failure to an operator (Step 505). When the reserving of the shared memory device 102 results in success (Step 503), an entry having a data set name according with the data set name requested to be reserved is detected from all entries of the duplex data set control table 108 (Step 508).

When the reserve request is in a data set write mode (Step 509), both the 0-side and 1-side reserve flags 202-1 and 202-2 (FIG. 2) of the detected entry are set to "1" (Step 516) in the case where both the two reserve flags 202-1 and 202-2 are "0" or in other words in the case where both the data sets of the two disk devices 110-1 and 110-2 are not reserved (Step 510), and then, a value indicating the reserve requesting central processing unit (intra-system CPU) is set as the reserve CPU number 203-1, 203-2 in the entry (Step 517). When the intra-system central processing unit is the A-side one, this value is set to "0", when it is the B-side one, this value is set to "1".

After the setting is completed, the shared memory device 102 is released (Step 1321) and then the procedure is terminated at an ordinary exit (Step 519). If at least one of the reserve flags 202-1 and 202-2 is "1" (Step 510), or in other words, if the data set kept in at least one of the two shared disk devices as a target of reserve is reserved by the other CPU 101-1, or 101-2, the shared memory device 102 is once released to wait for the releasing of the reserved data set (Step 1321). If the number of times in a data set reserving failure is within a predetermined value (Step 512), the data set reserving procedure (Step 1301) is carried out after waiting for about tens of msec (Step 515). If the number of times in data set reserving is over the predetermined value (Step 512), occurrence of abnormality pertaining to the data set reserving is supposed so that the procedure is terminated at a reserving failure exit (Step 514) after a data set reserving failure procedure (513).

When the data set reserve request is in a data set read mode (Step 509), a judgment is first made as to whether or not the blockage flag 204-1 (FIG. 2) for the 0-side data set of the detected entry is "1" (Step 520), because the procedure is completed by reserving one access-enabled data set. If the flag is "0" (there is no blockage), a judgment is made as to whether or not the data set is reserved (whether or not the flag 202-1 is "1") (Step 521). If the data set is not reserved, the 0-side reserve flag 202-1 is set to "1" (Step 522) and then a value corresponding to the intra-system central processing unit is set in the reserve CPU number 203-1 (Step 523). When the 0-side data set is blocked (Step 520) or reserved (Step 521), the same procedure as in the 0-side data set is applied to the 1-side data set (Steps 524, 525, 526, 527). If the 1-side data set is also blocked (Step 524) or reserved (Step 525), the reserving operation (Steps 512, 515, 1301) is retired after the shared memory device 102 is once released in the same manner as in the writing procedure.

FIG. 6 is a flow chart of the data set releasing procedure 601. Also in the data set releasing procedure, the shared memory device 102 of FIG. 1 is first reserved as in the case of the data set reserving procedure and then a procedure for finding a coincidence entry of the duplex data set control table 108 corresponding to the data set designated by the release request is carried out (Steps 1301, 503, 504, 505, 507, 508).

When the reserve CPU number 203-1 of the 0-side data set in the coincidence entry has a value corresponding to the reserve requesting central processing unit (intra-system central processing unit) (Step 602) and when the value of the 0-side reserve flag 202-1 is "1" (Step 603), the reserve flag 202-1 is set to "0". Further, when the occurrence of an error in the read/write operation of the 0-side data set is indicated, that is, when EDV0 is "1" (Step 605), the 0-side blockage flag 204-1 is set to "1". The same procedure is applied to the 1-side data set (Steps 607, 608, 609, 610, 611). After the aforementioned operation of the releasing procedure is completed, the shared memory device is released (Step 1321) and then the data set releasing procedure 601 is terminated (Step 613).

In the following, the structure and operation of the shared memory device 102 are described.

Figure 11:
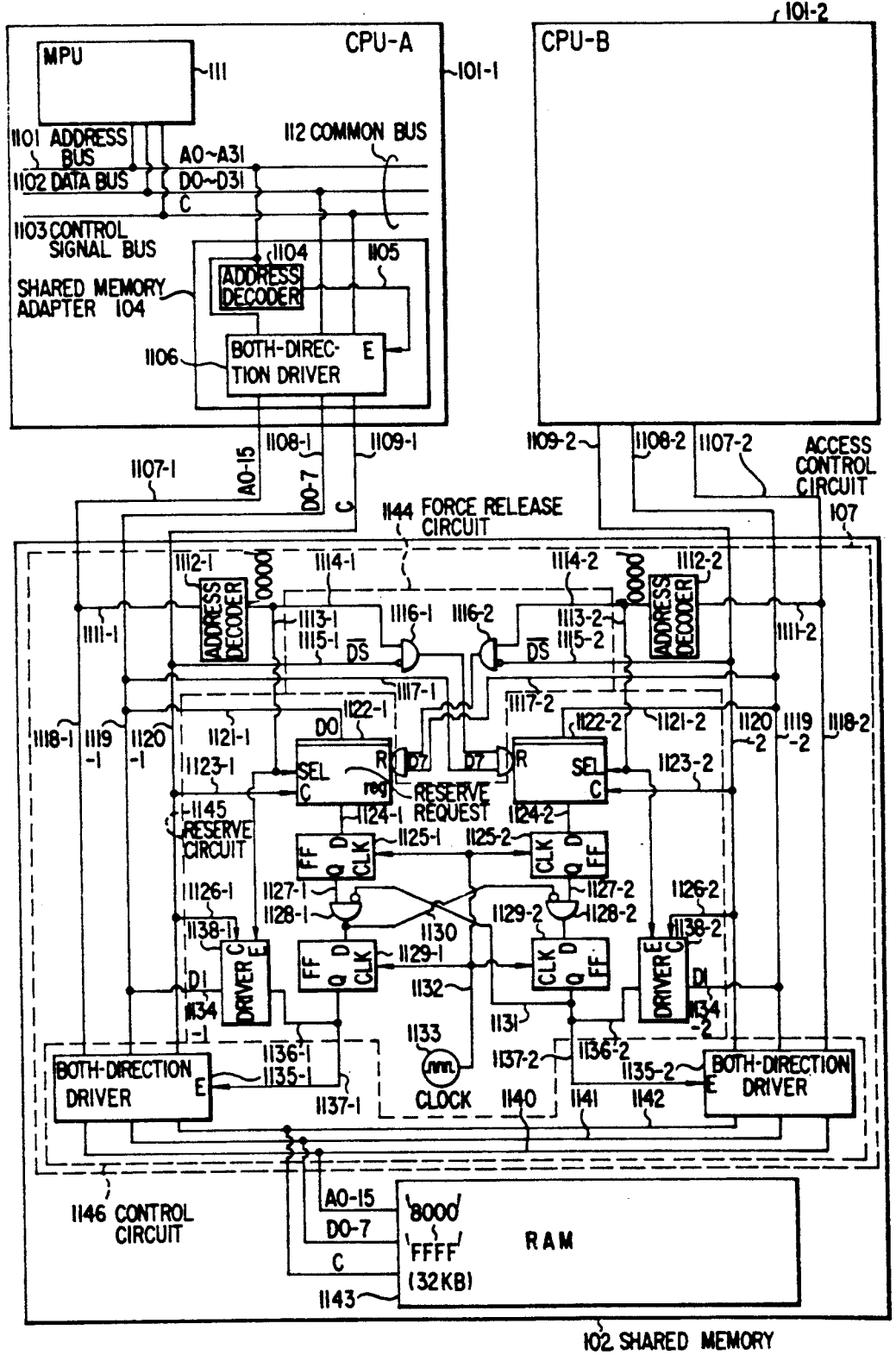
FIG. 11 is a detailed circuit diagram of the shared memory (102) used in the system depicted in FIG. 1.

FIG. 11 is a circuit diagram showing the connection between the central processing units 101-1, 101-2 and the shared memory device 102. The central processing units 101-1 and 101-2 have the same construction. Accordingly, the central processing unit 101-1 is mainly explained hereunder.

A micro-processor 111 is provided within the central processing unit 101-1 so as to execute a program as a central processing unit. Accordingly, the access control onto the shared disk devices 110-1 and 110-2 is carried out according to the program executed by the micro-processor 111, and the duplex data set control table 108 placed on the random access memory (RAM) 1143 in the shared memory device 102 is accessed.

The fact that the central processing unit 101-1 executes the reading and writing of exclusive control information on shared memory device 102 means that the micro-processor 111 reads data recorded on the ARAM 1143 in the shared memory device 102 and writes data in the RAM 1143 in the shared memory device 102.

In the circuits in the shared memory device 102, portions other than an address bus 1140, a data bus 1141, a control bus 1142 and the RAM 1143 form an access control circuit 107 for exclusively controlling the shared memory access of the two central processing units 101-1 and 101-2. The access control circuit 107 is mainly composed of a bus select circuit 1146, a reserve circuit 1145, and a force release circuit 1144.

In the following, a method in which the microprocessor 111 makes access to the shared memory device 102 is described.

An access request from the micro-processor 111 to the shared memory device 102 is generated based on an instruction, such as MOVE.B & H7F008000,D3 (to store one-byte's data from the address '7F008000' into the least significant byte of data register No. 3 provided within the micro-processor 111), MOVE.B D4,&H7F000000 (to store the least significant byte of data register No. 4 provided within the micro-processor 111 into the address '7F000000'), and the like, and reaches the shared memory adapter 104 through a common bus 112 connected to the micro-processor 111.

The shared memory adapter 104 receives data flowing in the address bus 111 through an address decoder 1104 and turns on a signal line 1105 indicating coincidence of the address if the address has a value within an address range allocated to the shared memory device 102. In this embodiment, the address range allocated to the shared memory device 102 is from '7F000000' to '7F00FFFF'. Accordingly, the address decoder 1104 is established to generate a coincidence signal when the most significant 16 bits A31–A16 of the address bus 1101 form '7F00'. When the signal line 1105 is turned on, a both-direction driver 1106 is turned to an enabled state so that the signal in the common bus 112 in the central processing unit 101-1 flows in signal lines 1107-1, 1108-1, 1109-1 connecting between the central processing unit 101-1 and the shared memory device 102 and then reaches an A-side address bus 1118-1, a data bus 1119-1 and a control bus 1120-1 in the shared memory device 102.

When the address does not coincide, the both-direction driver 1106 is not in the enabled state so that the driver is kept in a broken state in the inside thereof. As a result, the signal in the common bus 112 in the central processing unit 101-1 does not flow into the shared memory device 102.

As described above, the central processing unit 101-1 can make access to the shared memory device 102 based on general instruction such as MOVE instruction or the like.

The address at the time of access on the shared memory device 102 is as follows.

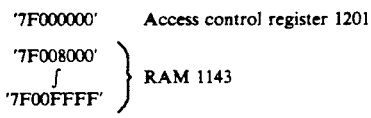

The meaning of the access control register 1201 is as shown in FIG. 12.

Before the operation of the access control circuit 107 will be described, the method of using the access register 1201 is described with reference to FIG. 12.

Registers and logical gates are assigned to suitable positions (in this embodiment, '7F000000' in the memory space of the micro-processor 111) in order to carry out necessary control at the time of shared memory access of the micro-processor 111, so that the access control register 1201 is used as a "register" controlled according to the program operating on the micro-processor 111.

In the access control register 1201, the least significant bit D0 1204 is a reserve request RESVREQ bit indicating a request to access the shared memory device 102; the next bit D1 1203 is a reserve acknowledge RESVACK bit for the shared memory device 102; and the bit D7 1202 as the seventh-power of 2 is a force release FORCEREL bit for forcedly canceling the reserved state by the other-system central processing unit 101-2. When the RESVREQ bit is set to "1", the access control circuit 107 reports, using the RESVACK bit, whether or not the reserve is completed. The RESVACK bit of "0" indicates non-completion of reserve. The RESVACK bit of "1" indicates completion of reserve. The RESVREQ bit is set by writing of the value of "1" and reset by writing of the value of "0". The RESVACK bit is set by the completion of the reserve and reset by the resetting of RESVREQ. When the value of "1" is written in the FORCEREL bit, the reserve of the other central processing unit 101-2 is forcedly canceled. The FORCEREL bit takes the value of "1" in the moment the value of "1" is written in the bit. Except the moment, the FORCEREL bit is always reset to "0".

In the following, the operation of the access control circuit 107 is described with reference to FIG. 11.

In FIG. 11, the access control circuit 107 is designed to satisfy the aforementioned specification pertaining to the operation of the access control register 1201. This circuit is composed of a circuit used for the central processing unit-A 101-1, and a circuit used for the central processing unit-B 101-2, the circuits being similar to each other. Accordingly, the circuit for the central processing unit-A 101-1 is mainly explained and the circuit for the central processing unit-B 101-2 is not explained except for different points between these circuits.

First, the reserve circuit 1145 for controlling the reserve state of the shared memory device 102 of the access control circuit 107 is described. The reserve request register 1122-1 registers the request to reserve the shared memory device 102, of the central processing unit 101-1. The writing in the register 1122-1 is carried out based on the address decoder 1112-1 when the least significant 16 bits of the address bus 1111-1 take the value of '0000'. The value written in the register is the value of the least significant bit D0 of the data bus 1121-1 in the writing timing designated to the control bus 1123-1.

The value of the reserve request register 1122-1 is fed to an enable terminal of the both-direction driver 1135-1 through the output line 1124-1 via two stages of flip-flop circuits 1125-1 and 1129-1. In short, the primary object of the access control circuit 107 is in that only one of the drivers 1135-1 and 1135-2 respectively used for the central processing unit-A 101-1 and the central processing unit-B 101-2 is turned to an enable state by the operation of the access control circuit. In short, the fact that the reserve of the shared memory device 102 results in success means the fact that the signal having the value of "1" is fed to the signal lines 1137-1 and 1136-1 or the signal lines 1137-2 and 1136-2.

To realize this, an AND gate 1128-1 is provided between the two stages of flip-flop circuits 1125-1 and 1129-1. In the case the reserve request from the central processing unit-B 101-2 has been accepted at the point of time when the reserve request from the central processing unit-A 101-1 is generated, the signal line 1131 takes the value of "1" so that the D input of the flip-flop circuit 1129-1 takes the value of "0" to thereby make it impossible to accept the reserve request from the central processing unit-A 101-1. On the contrary, in the case where there is no reserve request coming from the central processing unit-B 101-2, the signal line 1131 takes the value of "0" so that the D input of the flip-flop circuit 1129-1 takes the value of "1" to make the value of the Q output thereof "1" to thereby make the reserve result in success.

Each of the flip-flop circuits 1125-1 and 1129-1 is of a type in which an input is received in the D terminal at a leading edge of a timing pulse given to the clock terminal and the input value is sent out from the Q terminal at the next trailing edge of the timing pulse. When a clock generator 1133 for forming input timing or output timing produces clock pulses having a frequency not less than about 10 MHz, the pitch of the input timing of the flip-flop circuit can be reduced to be not more than 0.1 μsec so that the value of the reserve request register 1122-1 can be inputted at this pitch. On the other hand, the instruction execution period of the central processing units 101-1 and 101-2 is not less than about 0.3 μsec, and therefore, even if the contents of the reserve request register 1122-1 is rewritten at the highest speed, the request can be accepted at a sufficiently high speed without missing the change of the value of the reserve request register 1122-1.

The reserve control based on the RESVREQ bit 1204 can be carried out as described above. To send out the RESVACK bit 1203, the output of the flip-flop circuit 1129-1 is connected to the data bus 1134-1 D1 as a second least significant bit of the address '7F0000000' with respect to the '7F000000' read request issued from the central processing unit-A 101-1. In short, the output line 1136-1 of the flip-flop circuit 1129-1 for indicating success in the reserve of the shared memory device 102 is connected to the second least significant bit D1 1134-1 of the data bus 1119-1 through the driver 1138-1, which is turned to an enable state when the micro-processor 111 reads the address '7F000000'. Accordingly, when the address '7F000000' is read, completion or non-completion of the reserve of the shared memory device 102 can be indicated in the second least significant bit thereof.

In the following, description will be made about the bus select circuit 1146 for selecting the connection of the buses to the RAM 1143 as to which buses are to be connected to the RAM 1143, the central processing unit 101-1 side buses or 101-2 side buses, that is, address bus 1118-1 or 1118-2, data bus 1119-1 or 1119-2, and control signal bus 1120-1 or 1120-2.

In the reserve circuit 1145, only one of shared memory access requests from the central processing units 101-1 and 101-2 is accepted. In short, only one signal line 1137-1 or 1137-2 to be accepted takes the value of "1", so that only one both-direction driver 1135-1 or 1135-2 in the bus select circuit 1146 is turned to an enable state to thereby allow the central processing unit 101-1 or 101-2 connected to the enabled-state both-direction driver 1135-1 or 1135-2 to make access to the RAM 1143.

In the following, the force release circuit 1144 for forcedly releasing the reserve of the shared memory device 102 from the other-system central processing unit 101-1 or 101-2 is described.

The '7F000000' write request issued from the central processing unit-A 101-1 is accepted as writing in the FORCEREL bit 1202 of the access control register 1201 and detected by the AND gate 1116-1. Only in the case where the eighth least significant bit D7 1117-1 of the data bus at that point of time is "1", the reset terminal of the reserve request register 1122-2 of the other-system central processing unit-B 101-2 is turned on to make the value of the resister "0". Accordingly, the reserve state in the other system can be released forcedly.

The principle in which, when reserve requests come from the two central processing units 101-1 and 101-2 at the same time and the request of one central processing unit is accepted, the request of the other central processing unit is certainly accepted next is as follows.

When, for example, the request of the central processing unit-B 101-2 is accepted prior to the request of the central processing unit-A 101-1 so that the request of the central processing unit-A 101-1 is in a standby state, the value of the reserve request register 1122-1 is "1", and, accordingly, the value of the flip-flop circuit 1125-1 is "1". However, the output of the central processing unit-A side flip-flop circuit 1129-1 cannot take the value of "1" because the output of the central processing unit-B side flip-flop circuit 1129-2 has the value of "1". When the central processing unit-B 101-1 side reserve request is released under this condition, the output of the flip-flop circuit 1129-2 is turned to "0" for at least one clock period. As a result, the output of the AND gate 1128-1 is turned to "1", so that the reserve request of the central processing unit-B 101-2 is cut off by the AND gate 1128-2 through the signal line 1130. By these operations, the flip-flop circuit 1129-1 takes the value of "1", so that the central processing unit-A 101-1 side reserving procedure is completed.

The access control circuit 107 of the shared memory device 102 operates as described above.

FIG. 13 is a flow chart of the procedure 1301 of reserving the shared memory device 102. As the shared memory device 102 ma have been already reserved by the other central processing unit 101-1 or 101-2, reserve retry is repeated 10 times at the maximum. A counter for the retry is set (Step 1302). The RESVREL bit 1204 is turned to '1' (Step 1303) by writing one byte '01' into the address '7F000000'. When the value of the byte read from the address '7F000000' is '02', the value '02' indicates that the RESVACK bit 1203 is '1'. In this case, the procedure is terminated as success in the reserve (Step 1307). If the RESVACK bit 1204 is "0", the retry is repeated in the retry loop (Step 1304). Then, the loop count is decreased by one (Step 1306). If the loop count is not '0', the retry is repeated in the retry loop (Step 1306). When the loop count is '0', the procedure is terminated after the return code is set to '4' for the purpose of indicating a failure in reserve (Step 1309).

As shown in FIG. 14, the procedure 1321 of releasing the shared memory device 102 is terminated (Step 1323) after the RESVREQ bit 1204 is turned to '0' (Step 1321) by writing one byte '00' into the address '7F000000'.

The procedure 1331 of forcedly releasing the shared memory device 102 by the other central processing unit 101-1, 101-2 is terminated (Step 1333) after the FORCEREL bit 1202 is turned to '1' (Step 1332) by writing one byte '80' into the address '7F000000'.

Figure 15:
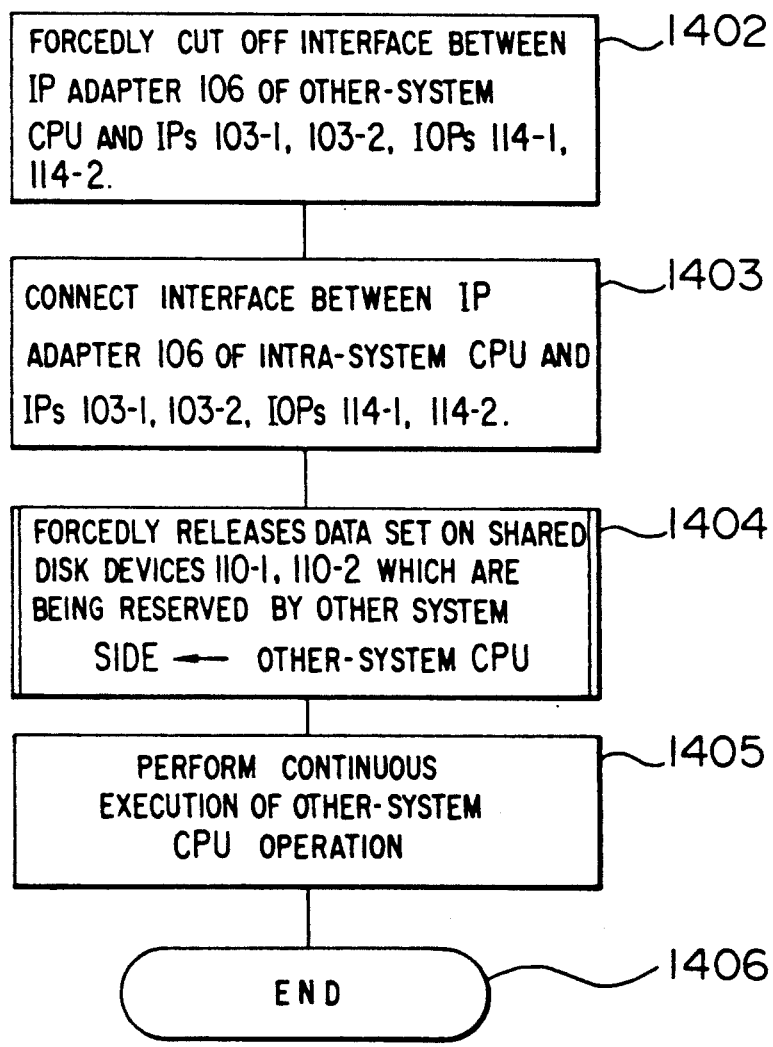
FIG. 15 is a flow chart of a CPU alternating procedure.

FIG. 15 is a flow chart for explaining the operation requiring the forcedly releasing procedure 1331. In the case where execution of the program is stopped by a failure or the like while the other-system central processing unit 101-1 or 101-2 reserves the shared memory device, there is a risk that the shared memory device cannot be released as it is in the reserved state. Because the duplex data set control table 106 containing blockage information for each data set exists on the shared memory device 102, shortage of blockage information makes it impossible to access the duplex disk devices if the shared memory device 102 cannot be accessed. Accordingly, in such a case, it is necessary to release the reserved state by the other-system central processing unit 101-1 or 101-2 forcedly.

In the case where the other-system central processing unit 101-1 or 101-2 stops, the intra-system central processing unit 101-2 or 101-1 detects the failure of the other-system central processing unit by means of the mutually supervisory line 126 so as to start the CPU alternating procedure 1401.

The alternating procedure of the central processing units 101-1 and 101-2 starts from the procedure (Step 1402) of forcedly cutting off the interface between the CPU adapter 106 of the failure-side central processing unit and the IP 103-1 or 103-2 and the IOP 114-1 or 114-2. Then, the interface between the IP adapter 106 of the intra-system central processing unit 101-2 or 101 1 and the IP 103-2 or 103-2 and the IOP 114-2 or 114-1 is connected (Step 1403). By the aforementioned Procedure, the processing by the IP 103-1 or 103-2 and the IOP 114-1 or 114-2 is passed over from the other-system central processing unit to the intra-system central processing unit. Then, the procedure (Step 1404) of forcedly releasing the data sets on the pair of shared duplex disk devices 110-1 and 110-2 reserved by the other-system central processing unit is carried out. Then, the operation of the other-system central processing unit is carried out continuously (Step 1405).

Figure 16:
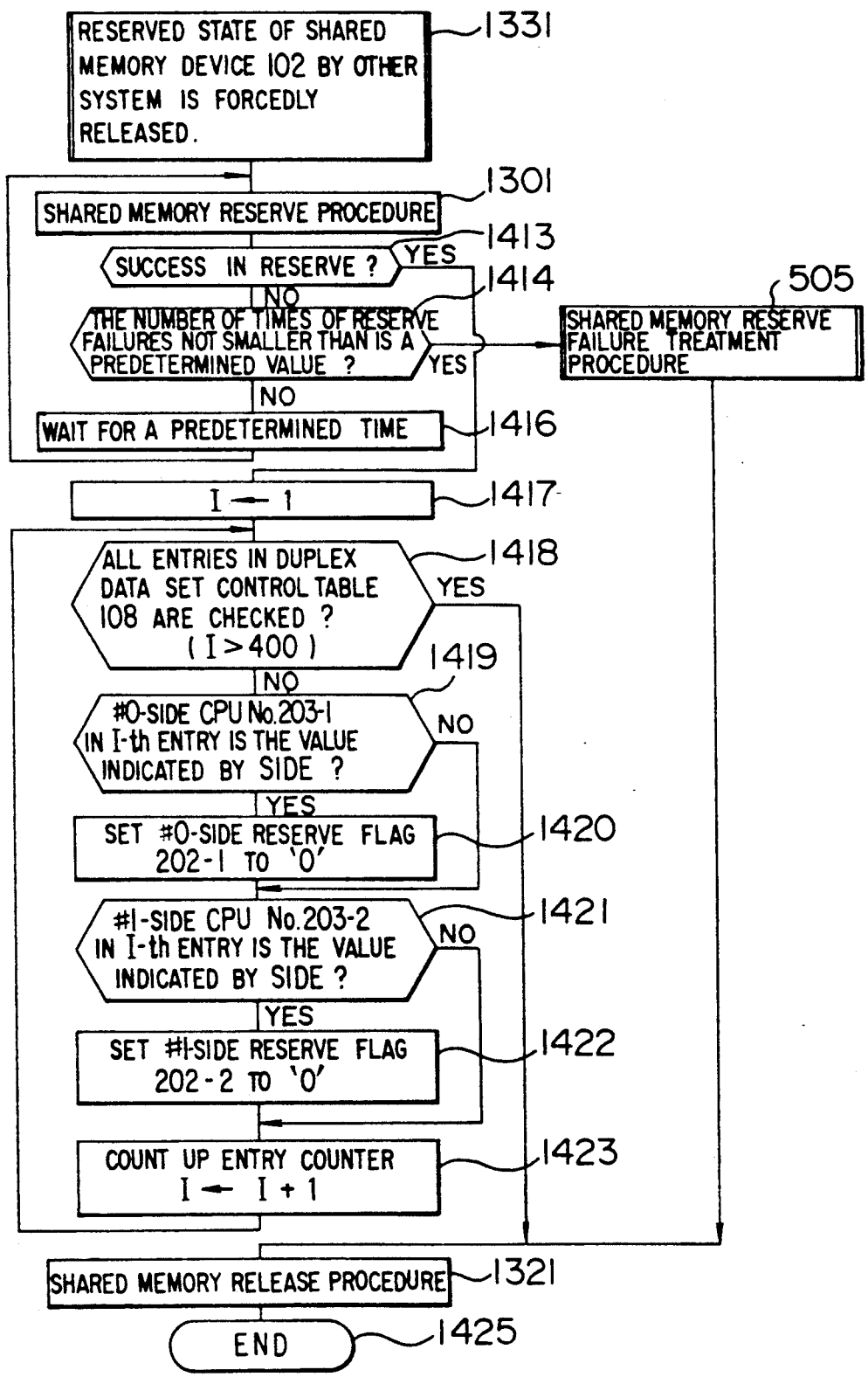
FIG. 16 is a flow chart of a shared disk device forcedly releasing procedure.

The procedure 1404 of forcedly releasing the data sets on the shared duplex disk devices 110-1 and 110-2 left in a state in which the data sets are reserved by the other-system central processing unit stopping because of occurrence of failure is carried out as shown in FIG. 16. First, the shared memory device 102 is released forcedly (Step 1331). The shared memory reserving procedure by the intra-system central processing unit 101-2 or 101-1 is carried out in the same manner as in the procedure in FIG. 5 (Steps 1301, 1413, 1414, 505, 1416). Then, data set reserve flags 202-1 and 202-2 on the duplex data set control table 108 left by the other-system central processing unit 101-1 or 101-2 are reset by the following procedure with respect to all duplex data sets existing on the pair of shared duplex DASDs.

First, the counter I for counting the duplex data set control table 108 for each entry is initialized to the initial value 1 (Step 1417). The value of the counter satisfying the relation I>400 means the fact that checking of entries corresponding to all data sets is completed. Accordingly, when the value of the counter is more than 400, the procedure is terminated after the shared memory device 102 is released (Steps 1321, 1425). Otherwise, the I-th entry is checked (Step 1418). When the value expressed by the #0-side reserve SVP number 203-1 in the I-th entry coincides with the value received by the SIDE parameter (Step 1419), the #0-side reserve flag 202-1 is turned to '0' (Step 1420). When the value expressed by the #1-side reserve CPU number 203-2 in the I-th entry coincides with the value received by the SIDE parameter (Step 1421), the #1-side reserve flag 202-2 is turned to '0' (Step 1422).

Further, the entry counter I is increased by one (Step 1423) in order to carry out the same checking on the next data set, and then the situation in the procedure is returned to the step 1418.

Figure 7:
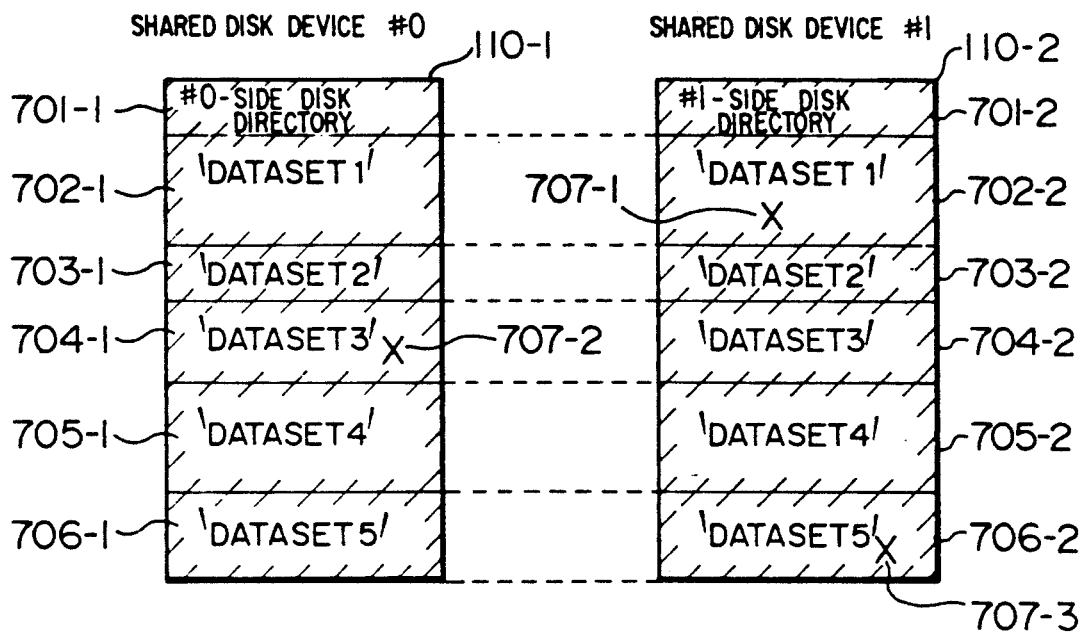
FIG. 7 is a view showing a data set blocking state at the time of access failure in a conventional control method.
Figure 8:
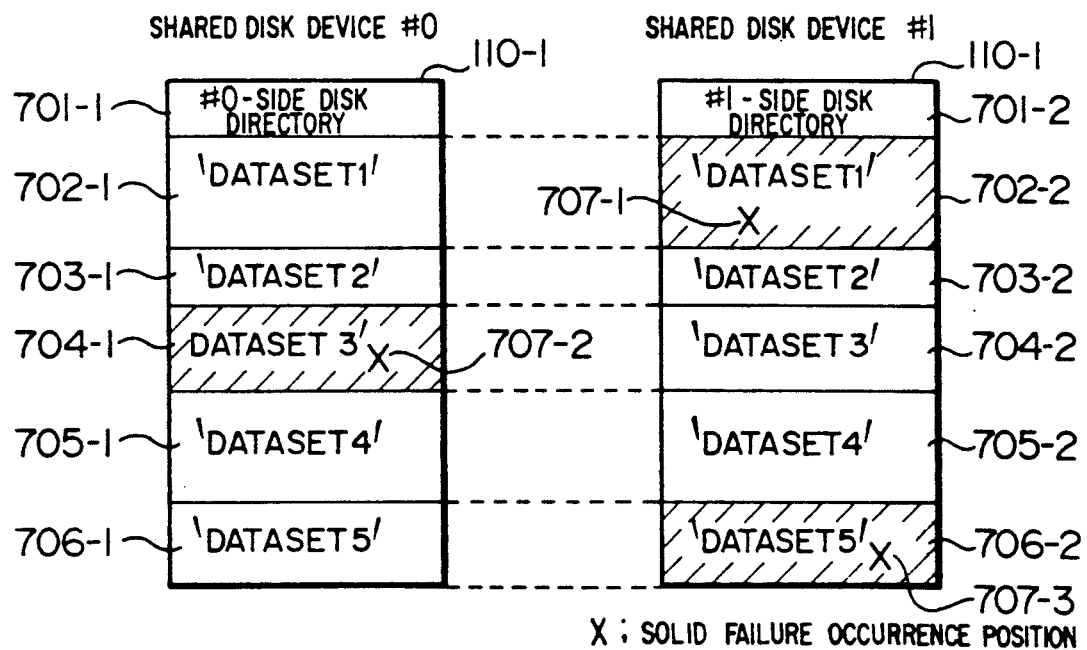
FIG. 8 is a view showing a data set blocking state at the time of access failure in the present invention.

Because exclusive control for each data set and blockage for each data set can be made by the aforementioned operation, there is no access-disabled data set expect the data sets 704-1, 702-2 and 706-2 even in the case where partial stationary failures 707 occur in the pair of duplex disk devices 110-1 and 110-2 as shown in FIG. 8. In short, the risk that no data set in the two systems can be used can be reduced. FIG. 7 is a view showing a conventional method in which both exclusive control and blocking control are carried out for each data set. When, in the conventional method, a failure occurs in one portion on each of the two disk devices, no data disk on the pair of duplex disk devices can be accessed.

Figure 9:
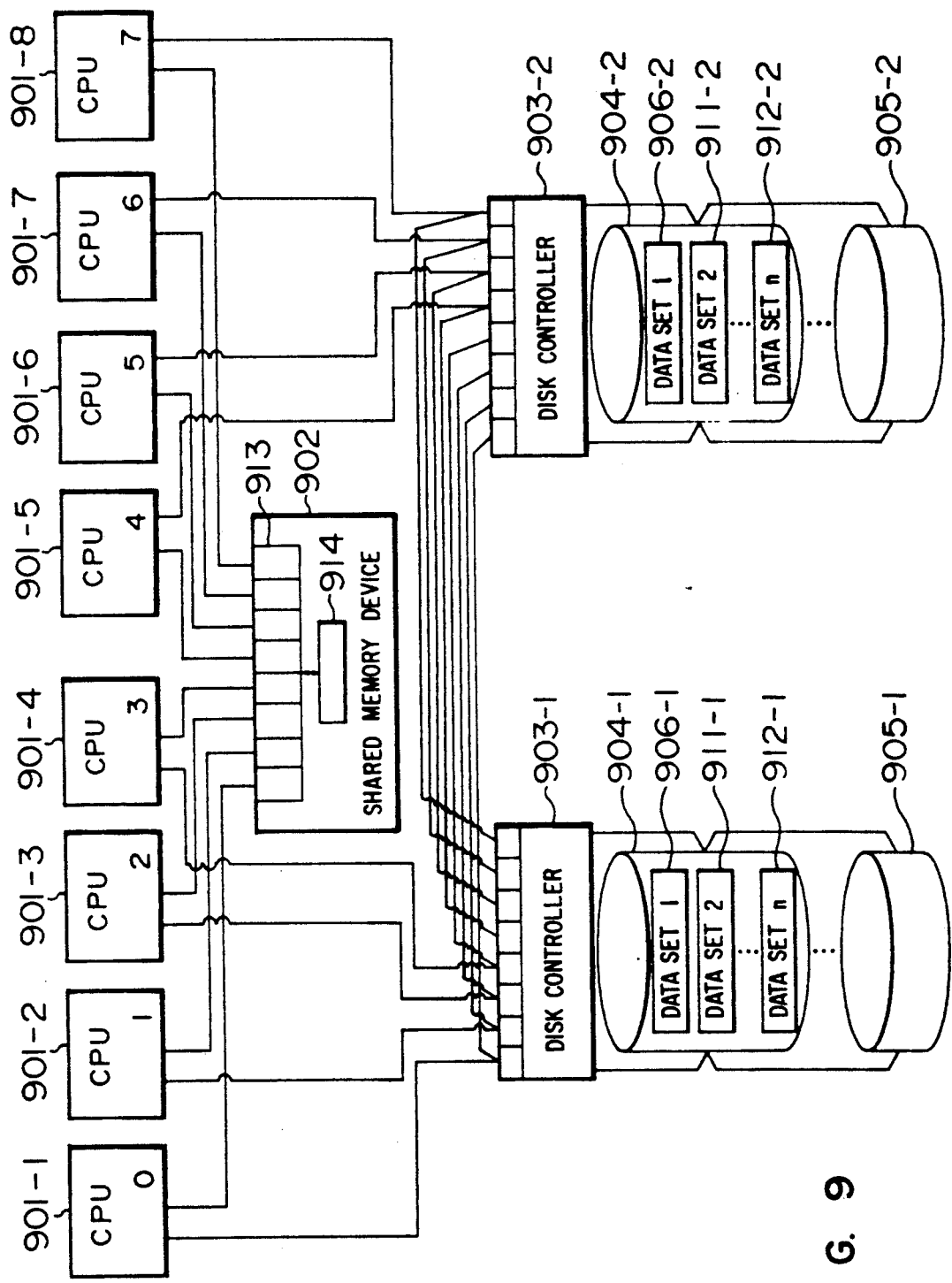
FIG. 9 is a block diagram of a system in which eight central processing units control the shared duplex data sets.

FIG. 9 is a block diagram showing an embodiment of the invention in which the invention is applied to a composite computer system having eight independent central processing units.

In this embodiment, the eight central processing units 901-1 through 901-8 are designed to share a pair of shared duplex disk devices 904-1 and 904-2 having n pairs of duplex data sets, that is, data set-1 906-1 and 906-2, data set-2 911-1 and 911-2, . . . , data set-n 912-1 and 912-2. The disk devices 904-1 and 904-2, and 905-1 and 905-2 are connected respectively via two disk controllers 903-1 and 903-2 to the input/output channels on the central processing units. Disk devices 905-1 and 905-2 other than the shared duplex disk devices 904-1 and 904-2 are not specifically limited in structure. Further, a shared memory device 902 is connected in order to apply the invention to access control of the pair of shared duplex data sets on the pair of shared duplex disk devices. A semiconductor storage device connected via input/output channels from the central processing units 901-1 through 901-8 and accessed according to an input-/output starting instruction or a shared memory device directly accessed according to a shared memory access instruction can be used as the shared memory device. A duplex data set control table 914 is stored on the shared memory device 902.

Figure 10:
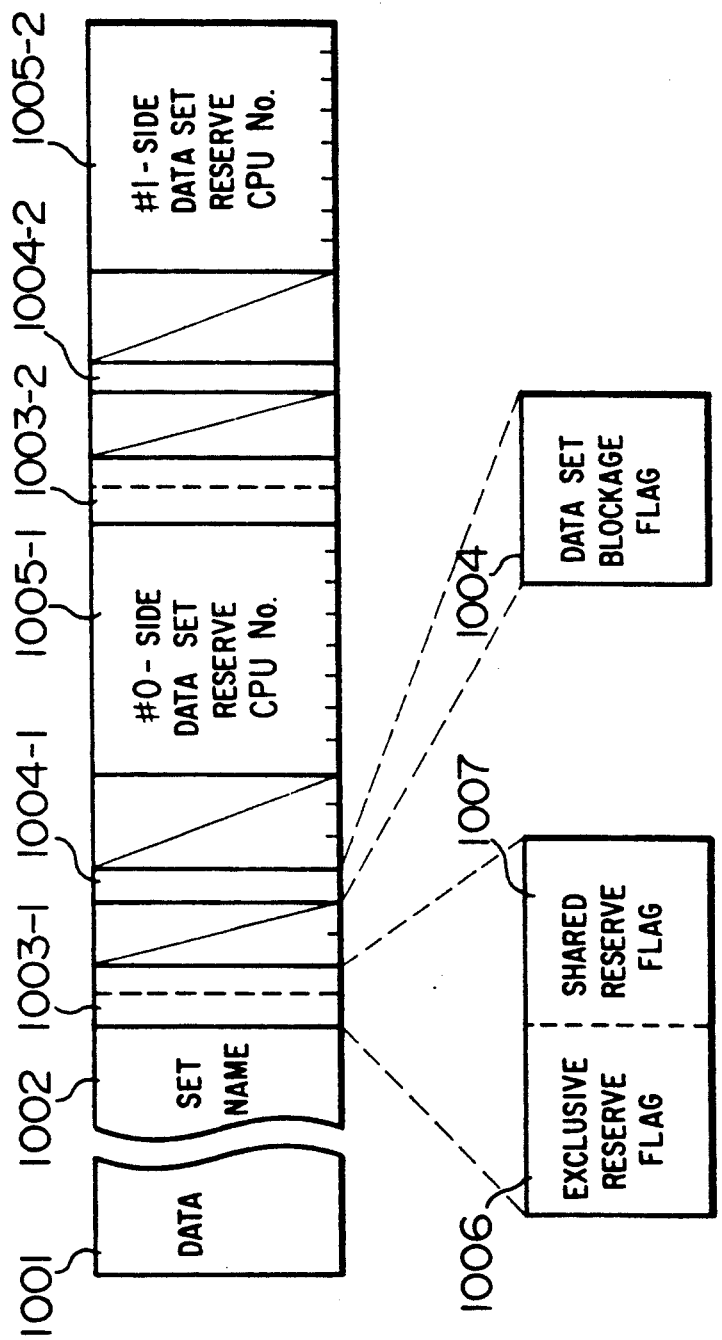
FIG. 10 is a view showing an entry of a duplex control table for controlling exclusive and shared reserve used in the system depicted in FIG. 9.

FIG. 10 is a view showing one-data-set's entry of the duplex data set control table in this embodiment. In general, reference of data sets by a plurality of computer systems is separated into exclusive reference and shared reference. Therefore, an exclusive reserve flag 1006 and a shared reserve flag 1007 are provided in each of the reserve flags 1003-1 and 1003-2 in the duplex data set control table 1001 corresponding to one entry. In the case where exclusive use such as "data set write" is required for updating the content recorded in the data sets, the right of accessing to the data sets is given by the exclusive reserve flag 1006-1 or 1006-2 of the two-system data sets. In the case where shared use such as "data set read" without updating the content recorded in the data sets is required, the right of accessing to the data sets can be given by setting one-system shared reserve flag to '1' but the shared reserve of the same data set by the plurality of central processing units 901-1 or 901-2 . . . or 901-8 is not suppressed.

The data reserving procedure in this embodiment is different from that in the first embodiment in the following point. In short, in the data set reserving procedure 501 in the first embodiment, only one of the pair of duplex data sets is reserved at the time of data set reading. On the contrary, in this embodiment, the common reserve flag for the two data sets and the common reserve flag 1007 for the pair of reserve flags 1003-1 and 1003-2 are set to '1', so long as one data set is not exclusively reserved, or in other words, so long as the exclusive reserve flag 1006 in one of the pair of reserve flags 1003-1 and 1003-2 in a corresponding entry of the data set control table 914 is not '1'.

In the case where at least one of the exclusive reserve flags 1006 takes the value of '1', the reserving procedure for data set reading or data set writing results in a failure.

Further, at the time of data set writing, exclusive reserve of data sets is carried out only when the exclusive reserve flags 1006 and the common reserve flags 1007 in the reserve flags 1003-1 and 1003-2 in the pair of duplex data sets are all '0'. In short, the exclusive reserve flags 1006 in the pair of reserve flags 1003-1 and 1003-2 are turned to '1' only when the exclusive reserve flags 1006 and the common reserve flags 1007 are all '0'. In other cases, exclusive reserve results in a failure.

Further, data set blockage flags 1004-1 and 1004-2 are flags provided to identify access-disabled data sets as in the first embodiment.

Further, each of data set reserve CPU numbers 1005-1 and 1005-2 is field provided to indicate the CPU number having the right of accessing data sets and is composed of 8 bits each expressing one central processing unit. The most significant bit corresponds to central processing unit No. 0. The least significant bit corresponds to central processing unit No. 7. When at least one bit in of the exclusive reserve flag 1006 or the common reserved flag 1007 in one reserve flag 1003-1 or 1003-2 is '1' and at least one bit of the reserve central processing unit number 1005-1 or 1005-2 field is '1', the fact that a corresponding central processing unit is the requester of the data set reserve is suggested.

The CPU number 1005-1 or 1005-2 field is established as follows. When the data set reserve flag 1003-1 or 1003-2 is set to '1', a bit corresponding to the central processing unit (901-1 through 901-8) executing the reserve request is turned to '1'.

When the reserve is released, a bit corresponding to the central processing unit (901-1 through 901-8) executing release request is turned to '0'.

According to this embodiment, in the case where data set exclusive control between central processing units is made, three or more central processing units can use one data set in common even if the central processing units read the data set simultaneously. Accordingly, lowering of system performance caused by occurrence of data set waiting can be prevented.

According to the invention, utility against a martial stationary access failure in a pair of shared duplex disk devices can be improved greatly.

We claim:

1. A DASD access control method for use in a computer system comprising a plurality of processing units, a memory connected to said plurality of processing units and duplex direct access storage devices (hereinafter "DASD's") accessible by said plurality of processing units, said duplex DASD's comprising a first DASD for storing a plurality of data groups in addressable storage locations therein and a second DASD for storing a plurality of data groups in addressable storage locations therein, said first DASD and said second DASD including identical contents and one-to-one correspondence between the data groups stored in corresponding storage locations therein, wherein each one of said data groups of said first DASD and each corresponding one of said data groups of said second DASD form a data group set and are accessible as a logical unit by one of said plurality of processing units, said DASD access control method comprising the steps of:

(a) storing information in said memory device for identifying the invalidity of data groups in which an irrecoverable failure has occurred within said plurality of data groups stored in said first DASD and said second DASD;

(b) judging whether one data group of a data group set stored in said first DASD and said second DASD and accessible by one of said plurality of processing units previously had an irrecoverable failure based on said stored information in said memory, when said one data group is accessed;

(c) accessing said one data group of said data group set when said step (b) results in a determination that said one data group does not have an irrecoverable failure; and (d) stopping access to said one data group of said data group set when said step (b) results in a determination that said one data group has an irrecoverable failure.

2. A DASD access control method according to claim 1, further comprising the steps of:

(e) judging whether the other data group of the data group set stored in the other of said first DASD and said second DASD has an irrecoverable failure based on said stored information in said memory only when the one data group is to be accessed for reading and said one data group already has an irrecoverable failure;

(f) accessing said other data group of said data group set for reading data, when said judgment step results in a determination that said other data group does not have an irrecoverable failure.

3. A DASD access control method according to claim 2, wherein said step (f) is executed in response to an access request issued by one of said plurality of processing units for reading said other data group which does not have an irrecoverable failure, only when said one data group already has an irrecoverable failure.

4. A DASD access control method according to claim 2, further comprising the steps of:

(g) stopping access to said one data group for both reading and writing when an irrecoverable failure occurs in said one data group during the execution of said step (c); and (f) executing said steps (e) and (f) respectively.

5. A DASD access control method according to claim 1, further comprising the steps of:

(e) judging by one of said plurality of processing units based on said information, whether the other data group of said data group set stored in the other of said first DASD and second DASD has an irrecoverable failure, irrespective of whether said one data group already has an irrecoverable failure, when an access requested by said one processing unit to said one data group is for writing;

(f) accessing said other data group of said data group set for writing of the identical data as written into said one data group, when said step (b) results in a determination that said other data group does not have an irrecoverable failure; and (g) stopping access for writing of data to said other data group when said step (b) results in a determination that said other data group has an irrecoverable failure.

6. A DASD access control method according to claim 5, wherein said step (f) is executed in response to an access request which is issued by one of said plurality of processing units for writing data into said other data group of said data group set when said one data group is to be accessed for writing of the data.

7. A DASD access control method according to claim 6, further including the step of rewriting the blockage flag corresponding to said other data group into a state indicating that a failure has occurred when an irrecoverable failure occurs in said other data group during the execution of said accessing step (f).

8. A DASD access control method according to claim 7, wherein said blockage flag rewriting step is conducted in response to a request generated by said one processing unit.

9. A DASD access control method according to claim 1, wherein said step (b) includes the steps of:

(b1) reading one blockage flag corresponding to said one data group to be accessed from among a plurality of blockage flags which are stored respectively corresponding to a plurality of data groups stored in said first DASD and said second DASD, wherein each one of said plurality of blockage flags indicates whether a corresponding data group has an irrecoverable failure for read or write operations; and (b2) judging whether said one data group has an irrecoverable failure for read or write operations based upon whether said blockage flag is in a state indicating that a failure occurred.

10. A DASD access control method according to claim 9, wherein said one blockage flag is read from a shared random access memory which is commonly accessible by said plurality of processing units, wherein said blockage flags are stored in said random access memory and correspond to said plurality of data groups stored in said first DASD and said second DASD.

11. A DASD access control method according to claim 10, wherein said blockage flag reading step is performed in response to a request from said one processing unit, and thereafter said judging step (b2) is executed.

12. A DASD access control method for use in a computer system comprising a plurality of processing units, and duplex direct access storage devices (hereinafter "DASD's") accessible by said plurality of processing units, said duplex DASD's comprising a first DASD for storing a plurality of data groups in addressable storage locations therein and a second DASD for storing a plurality of data groups in addressable storage locations therein, said first DASD and said second DASD including identical contents and one-to-one correspondence between the data groups stored in corresponding storage locations therein, wherein each one of said data groups of said first DASD and said corresponding one of said data groups of said second DASD form a data group set and are accessible as a logical unit by one of said plurality of processing units, said DASD access control method comprising the steps of:

(a) storing reserve flags exclusively in a random access memory which is commonly accessible by said plurality of processing units, said stored reserve flags respectively corresponding to said plurality of data groups stored in said first DASD and said second DASD, wherein each one of said reserve flags indicates whether the corresponding data group is in a reserved state;

(b) reserving said random access memory for one of said plurality of processing units when said one processing unit is to access one of said plurality of data groups of a data group set stored in said first DASD and said second DASD;

(c) subsequently reading one reserve flag corresponding to said one data group of a data group set from said random access memory;

(d) rewriting said one reserve flag into a reserve indicating state to reserve said one data group of a data group set when said one reserve flag which is read out is not in said reserve indicating state;

(e) releasing the reserved state of said random access memory; and (f) accessing said one data group.

13. A DASD access control method according to claim 12, further including the steps of:

(g) reserving said random access memory for said one processing unit after said accessing by said accessing step (f); and (h) subsequently rewriting the one reserve flag corresponding to said one data group of a data group set into a reserve released state to thereby release the reserved state of said one data group.

14. A DASD access control method according to claim 13, further comprising the steps of:

(i) detecting a data group reserved by said one processing unit among said plurality of data groups stored in said first DASD and said second DASD when a failure has occurred in said one processing unit; and (j) forcedly releasing the reserved state of said detected data group by said another processing unit.

15. A DASD access control method according to claim 14, further comprising the step of:

(j) storing, before the execution of the step (e), processing-unit identifying information assigned to said one processing unit as reserve processing-unit identifying information corresponding to said one data group, when said one stored reserve flag is rewritten into a reserve indicating state, wherein the step (h) includes the step of identifying, by the another processing unit, a processing-unit which has left the data group reserved, on aid reserve processing-unit identifying information stored in said duplexed DASD's for the data group left reserved.

16. A computer system comprising:

(a) a plurality of processing units;

(b) a first direct access storage device connected to said plurality of processing units for storing a plurality of data groups in addressable storage locations therein, wherein each one of said data groups are individually accessible as a logical unit by one of said plurality of processing units;

(c) a random access memory which is commonly accessible by said plurality of processing units for storing only a plurality of pieces of control information respectively corresponding to each of said plurality of data groups for controlling access from said plurality of processing units to said data groups; and (d) an access control circuit for controlling access from said plurality of processing units to said random access memory, wherein said plurality of processing units and said random access memory are connected to said access control circuit, said access control circuit including:

(d1) reserve means for reserving said random access memory for one of said processing units in response to a random access memory reserve request, and for releasing the reserved state of said random access memory in response to a random access memory reserve releasing request; and (d2) control means connected to said reserve means for controlling access to one of said pieces of control information in said random access memory requested by a request issued by one of the processing units, depending on whether said random access memory is in a reserved state with respect to said one processing unit.

17. A computer system according to claim 16, wherein said reserve means further includes means responsive to two reserve requests respectively executed by two of said plurality of processing units for preferentially reserving said random access memory for one of said two processing units when the other of said two processing units has previously reserved said random access memory.

18. A computer system according to claim 16, wherein said access control circuit further includes means for releasing the reserved state for said one processing unit in response to a request for forcedly releasing the reserved state issued by another processing unit when said random access memory remains reserved by said one processing unit.

19. A computer system according to claim 16, further comprising a second direct access storing device (DASD) for storing a plurality of data groups having the identical contents and corresponding in one-to-one relationship to said plurality of data groups stored in said first DASD to form pairs of data groups; and wherein said random access memory comprises:
a memory for storing pairs of control information respectively corresponding to said pairs of data groups, said data groups of each one of said pairs respectively stored in said first DASD and said second DASD and having identical content.

20. A computer system according to claim 19, wherein each pair of said control information are stored in said random access memory, together with a corresponding data group name common to the two data groups of a corresponding pair of data groups.

21. A computer system according to claim 19, wherein said control information corresponding to one data group includes:
a data group reserve flag for indicating whether said data group is reserved by one of said plurality of processing units for exclusive use of the data group for reading or writing;
a reserve processing-unit number for indicating one processing unit reserving said data group when said data group is reserved thereby; and
a data group blockage flag for indicating whether said data group already has a fixed failure therein.

* * * * *